US010628324B2

(12) United States Patent
Hara

(10) Patent No.: US 10,628,324 B2
(45) Date of Patent: Apr. 21, 2020

(54) MEMORY SYSTEM WITH CORE DIES STACKED IN VERTICAL DIRECTION

(71) Applicant: FUJITSU LIMITED, Kawasaki-shi, Kanagawa (JP)

(72) Inventor: Soji Hara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/120,821

(22) Filed: Sep. 4, 2018

(65) Prior Publication Data

US 2019/0102316 A1 Apr. 4, 2019

(30) Foreign Application Priority Data

Sep. 29, 2017 (JP) .................... 2017-189866

(51) Int. Cl.
*G06F 12/00* (2006.01)
*G06F 12/10* (2016.01)
(Continued)

(52) U.S. Cl.
CPC ............ *G06F 12/10* (2013.01); *G11C 5/02* (2013.01); *G11C 5/025* (2013.01); *G11C 5/063* (2013.01);
(Continued)

(58) Field of Classification Search
CPC ... G06F 12/10; G06F 2212/1044; G11C 5/02; G11C 5/063; G11C 5/025; G11C 8/12; H01L 25/0657; H01L 25/18; H01L 25/0652; H01L 2224/16146; H01L 2224/16227; H01L 2224/13025;
(Continued)

(56) References Cited

U.S. PATENT DOCUMENTS

2008/0101104 A1* 5/2008 Ikeda ................ G11C 5/02
365/51
2009/0175084 A1* 7/2009 Norman ............ G06F 13/1668
365/185.18
(Continued)

FOREIGN PATENT DOCUMENTS

JP 2002-26283 1/2002
JP 2016-99667 5/2016

OTHER PUBLICATIONS

Patent Abstracts of Japan English abstract for Japanese Patent Publication No. 2016-99667, published May 30, 2016.
(Continued)

*Primary Examiner* — Kalpit Parikh
(74) *Attorney, Agent, or Firm* — Staas & Halsey LLP

(57) ABSTRACT

A memory system includes N core dies (N: an integer greater than one) stacked in a vertical direction and including N respective memory circuits having a same structure, a control circuit configured to supply N write data to the N respective memory circuits, an address generating circuit configured to generate a single common address as write addresses at which the N write data are to be stored in the N respective memory circuits, and an address conversion circuit configured to convert the single common address to generate N addresses which are different for the N respective memory circuits and to supply the N addresses as write addresses to the N respective memory circuits.

4 Claims, 13 Drawing Sheets

(51) Int. Cl.
*G11C 5/02* (2006.01)
*G11C 5/06* (2006.01)
*G11C 8/12* (2006.01)
*H01L 25/065* (2006.01)
*H01L 25/18* (2006.01)

(52) U.S. Cl.
CPC ........ *G11C 8/12* (2013.01); *G06F 2212/1044* (2013.01); *H01L 25/0652* (2013.01); *H01L 25/0657* (2013.01); *H01L 25/18* (2013.01); *H01L 2224/13025* (2013.01); *H01L 2224/16146* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2924/1432* (2013.01); *H01L 2924/1434* (2013.01); *H01L 2924/15192* (2013.01)

(58) Field of Classification Search
CPC . H01L 2224/17181; H01L 2225/06517; H01L 2225/06541; H01L 2225/06513; H01L 2225/06565; H01L 2225/06568; H01L 2924/15192; H01L 2924/1434; H01L 2924/1432

See application file for complete search history.

(56) References Cited

U.S. PATENT DOCUMENTS

2012/0324141 A1* 12/2012 Seong ................. G06F 12/0238
 711/3
2016/0124810 A1* 5/2016 Yang ..................... G11C 29/52
 714/764

OTHER PUBLICATIONS

Patent Abstracts of Japan English abstract for Japanese Patent Publication No. 2002-26283, published Jan. 25, 2002.

* cited by examiner

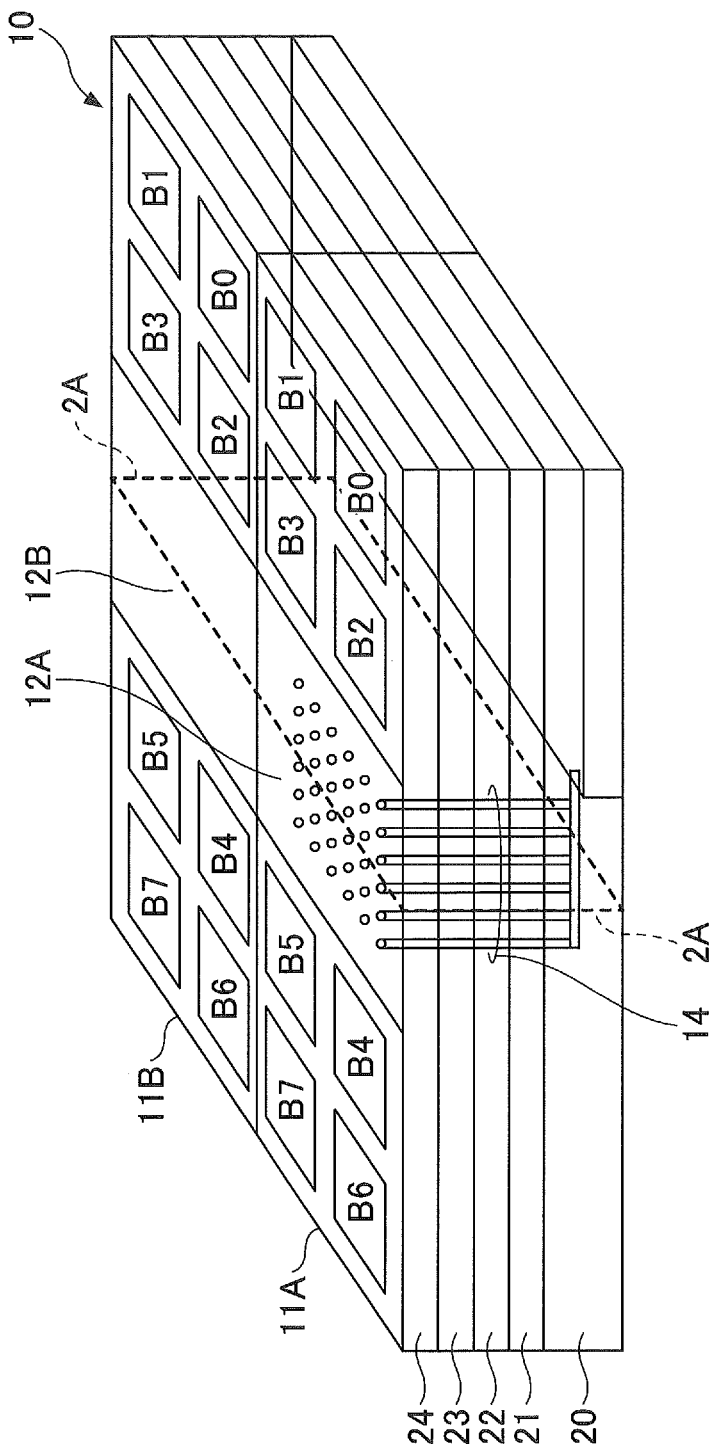

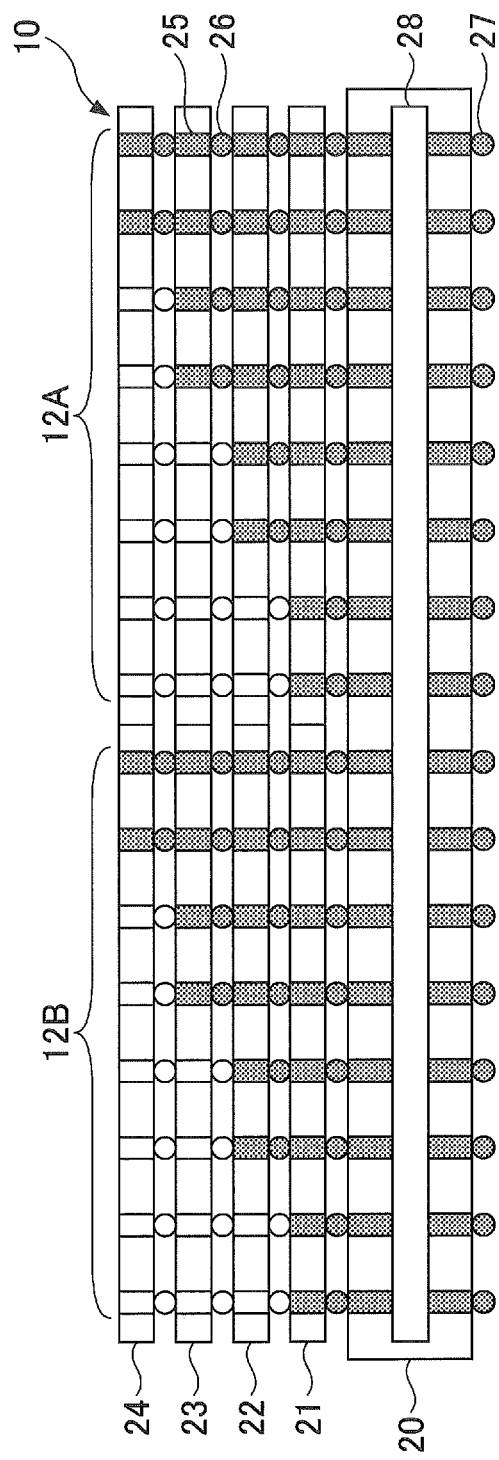

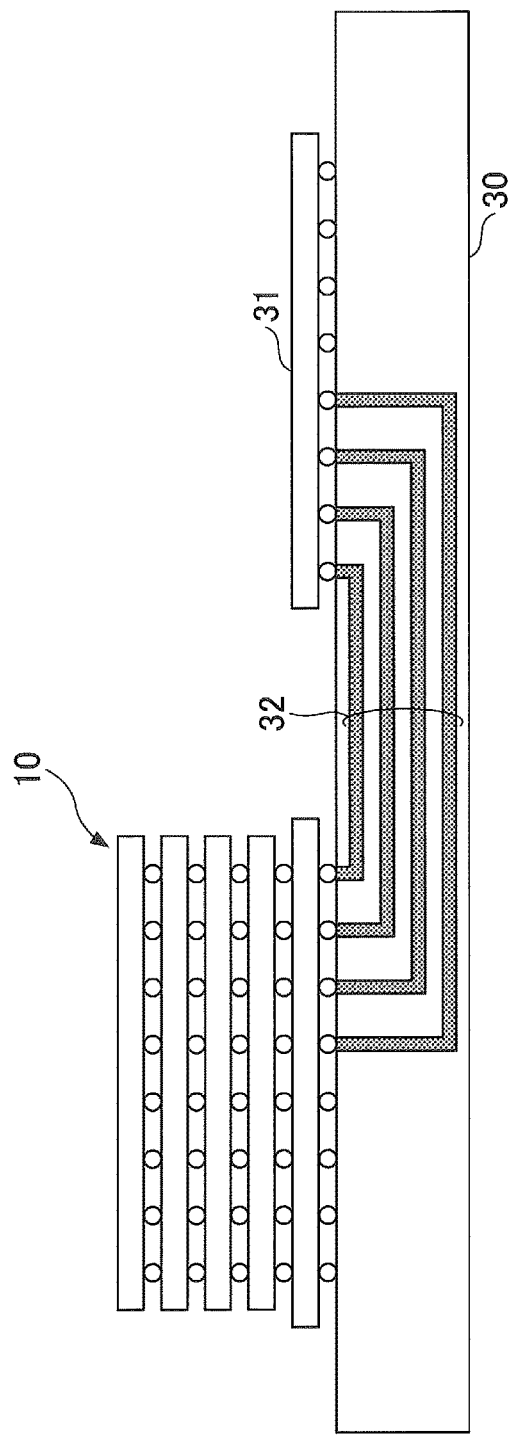
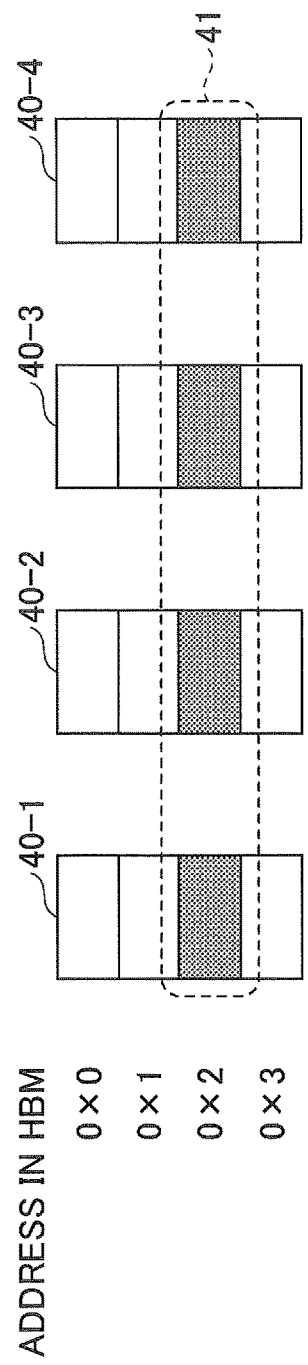

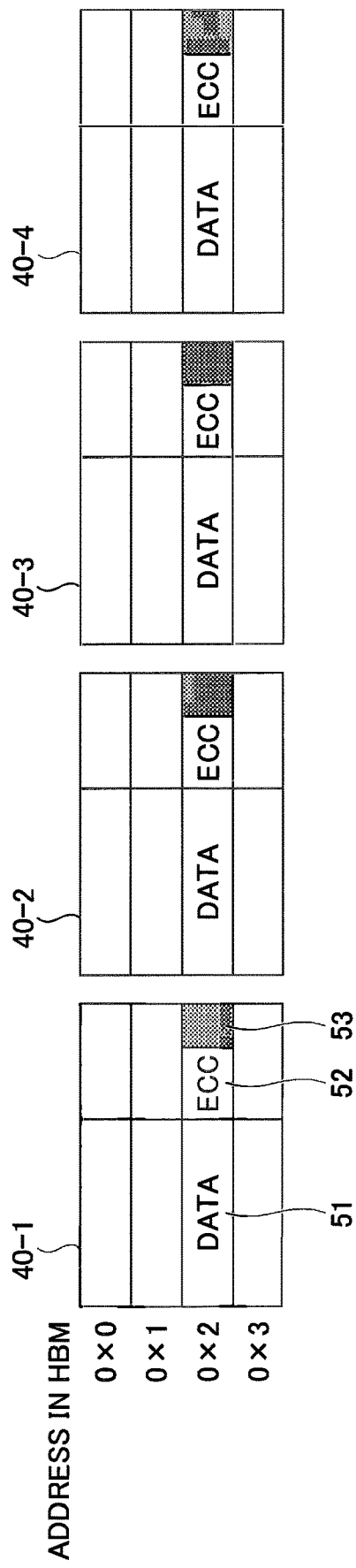
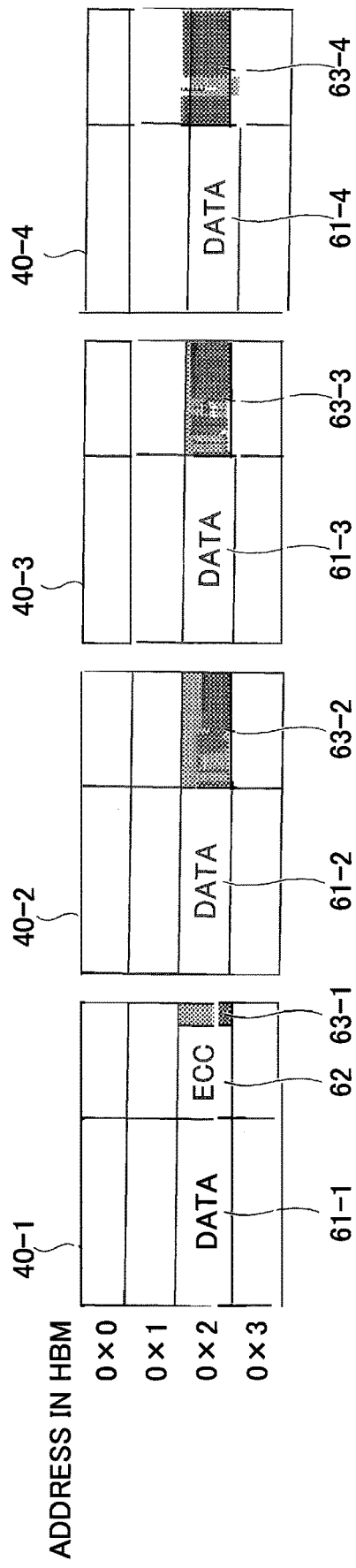

FIG.14

|  | FIRST CORE DIE | SECOND CORE DIE | THIRD CORE DIE | FOURTH CORE DIE |
|---|---|---|---|---|
| INVERSION CODE | 0b000 | 0b011 | 0b100 | 0b111 |

FIG.15

| PRE-CONVERSION BANK ADDRESS | CONVERTED BANK ADDRESS | | | |
|---|---|---|---|---|
| | FIRST CORE DIE | SECOND CORE DIE | THIRD CORE DIE | FOURTH CORE DIE |
| 0b000 | 0b000 | 0b011 | 0b100 | 0b111 |
| 0b001 | 0b001 | 0b010 | 0b101 | 0b110 |
| 0b010 | 0b010 | 0b001 | 0b110 | 0b101 |
| 0b011 | 0b011 | 0b000 | 0b111 | 0b100 |
| 0b100 | 0b100 | 0b111 | 0b000 | 0b011 |
| 0b101 | 0b101 | 0b110 | 0b001 | 0b010 |
| 0b110 | 0b110 | 0b101 | 0b010 | 0b001 |
| 0b111 | 0b111 | 0b100 | 0b011 | 0b000 |

MEMORY SYSTEM WITH CORE DIES STACKED IN VERTICAL DIRECTION

CROSS-REFERENCE TO RELATED APPLICATIONS

The present application is based upon and claims the benefit of priority from the prior Japanese Patent Application No. 2017-189866 filed on Sep. 29, 2017, with the Japanese Patent Office, the entire contents of which are incorporated herein by reference.

FIELD

The disclosures herein relate to a memory system and a method of controlling a 3D-stacked memory.

BACKGROUND

In recent years, it has been becoming more and more difficult to increase the volume of semiconductor memories through miniaturization alone, because of their structural limitations. In order to overcome this problem, a 3D-stacked memory has been developed that increases volume by stacking semiconductor memories in the vertical direction (i.e., thickness direction). Examples of the 3D-stacked memories include an HBM (High Bandwidth Memory), an HBM2, and the like standardized by the JEDEC (Joint Electron Device Engineering Council).

In the case of the HBM, for example, four core dies each having a DRAM structure are stacked on a base die. Each core die and the base die have through vias (TSV: through silicon via) formed therethrough, with micro bumps electrically coupling the through vias between vertically adjacent dies.

The core dies have the same structure, so that storing data at the same address in each core die results in the location of the stored data being at the physically same position in all the dies. Namely, in the plan view of the HBM as viewed from above, the locations of the data in the four cores are aligned. Data having a length of one word may be divided by four, and the resulting four pieces of data may be stored at the same address in the four core dies, respectively. In such a case, the one-word data is stored in plural locations at the same plan-view position in a distributed manner. Storing one-word data at the same plan-view position gives rise to the problem that soft error caused by a neutron ray has a great impact as will be described below.

A neutron ray included in cosmic rays is not electrically charged, and is thus more likely to reach the surface of the earth than charged particles. As a high-energy neutron ray reaching the surface of the earth hits a silicon atom contained in a semiconductor memory to generate a secondary ion, a large number of electrons are ejected from the silicon atoms lying on the flight path of the ion. These electrons serve to reverse the memory cell charge, thereby causing soft error.

A secondary ion caused by the impact of a neutron ray may be generated in the uppermost core die of an HBM. A length of a path passing through a plurality of core dies differs between the case in which the secondary ion flies in the direction perpendicular to the core dies (i.e., in the thickness direction of the core dies) and the case in which the secondary ion flies at an angle to the core dies.

In the case of the perpendicular-direction flight, the path of the ion passing through each core die is the shortest, and the path of the ion passing between adjacent core dies is also the shortest. It follows that the ion does not lose much of its energy while passing through a core die and reaching the next core die situated immediately below. As a result, the secondary ion generated by the impact of a neutron ray at the uppermost core die may penetrate plural core dies inclusive of the uppermost one, thereby creating a risk that data is destroyed by soft error in the plural core dies.

In the case of the slanting-direction flight, the path of the ion passing through each core die is relatively long, and the path of the ion passing between adjacent core dies is also relatively long. It follows that the ion experiences relatively great energy attenuation while passing through a core die and reaching the next core die situated immediately below. As a result, the secondary ion generated by the impact of a neutron ray at the uppermost core die is less likely to penetrate plural core dies inclusive of the uppermost one, with a less risk that data is destroyed by soft error in the plural core dies.

In the case in which the divided parts of one-word data are stored at the same plan-view position in a plurality of core dies, these stored data parts may all be destroyed at once by an ion flying in the vertical direction. There is thus a possibility that the entirety of one-word data suffers significant damage. In the case where error correction code such as ECC is put in place, one-bit error is correctable. However, errors occurring at two or more bits cannot be corrected. Accordingly, uncorrectable multiple-bit soft errors may occur when an ion caused by a neutron ray flies in the vertical direction as described above.

RELATED-ART DOCUMENTS

Patent Document

[Patent Document 1] Japanese Laid-open Patent Publication No. 2016-099667

[Patent Document 2] Japanese Laid-open Patent Publication No. 2002-026283

SUMMARY

According to an aspect of the embodiment, a memory system includes N core dies (N: an integer greater than one) stacked in a vertical direction and including N respective memory circuits having a same structure, a control circuit configured to supply N write data to the N respective memory circuits, an address generating circuit configured to generate a single common address as write addresses at which the N write data are to be stored in the N respective memory circuits, and an address conversion circuit configured to convert the single common address to generate N addresses which are different for the N respective memory circuits and to supply the N addresses as write addresses to the N respective memory circuits.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2 is a drawing illustrating an example of the configuration of an HBM that is an example of the 3D-stacked memory;

FIG. 3 is a drawing illustrating the configuration of a cross-section of the HBM taken along the dotted line 2A in FIG. 2;

FIG. 4 is a drawing illustrating an example of the configuration of a memory system having the HBM that is an example of the 3D-stacked memory;

FIG. 5 is a drawing illustrating an example of the configuration of a single bus formed by consolidating the 4 channels of 4 core dies;

FIG. 7 is a drawing for explaining relationships between information bits and error correction bits;

FIG. 8 is a drawing for explaining relationships between information bits and error correction bits;

FIG. 14 is a drawing illustrating an example of inversion codes used for address conversion;

FIG. 15 is a drawing illustrating pre-conversion addresses and converted addresses in the case of using the inversion codes illustrated in FIG. 14;

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
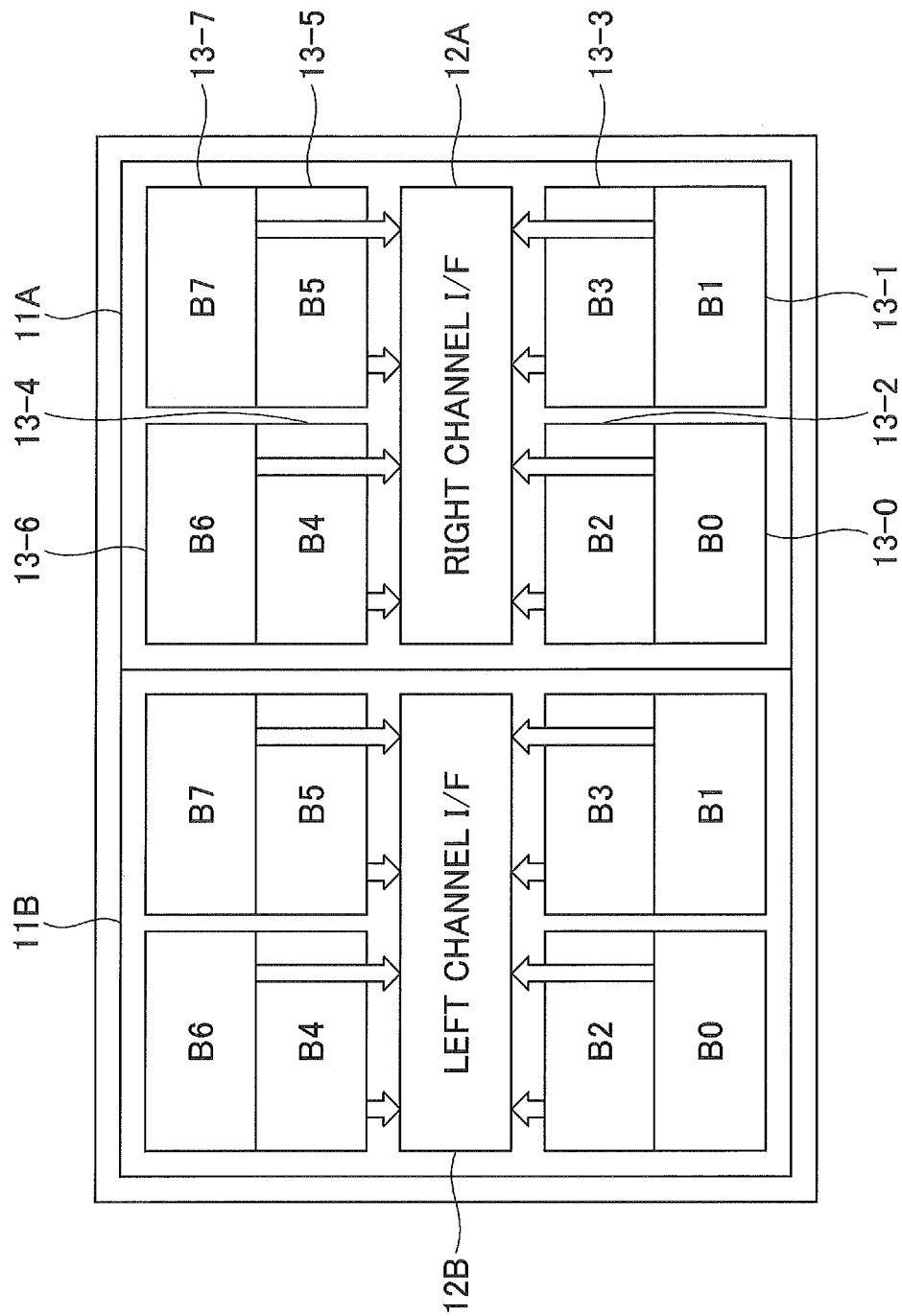
FIG. 1 is a drawing illustrating the configuration of a core die used in a HBM that is an example of a 3D-stacked memory.

FIG. 1 is a drawing illustrating the configuration of a core die used in an HBM that is an example of a 3D-stacked memory. In the following description, the disclosed technology will be described by referring to an HBM serving as an example of a 3D-stacked memory. Notwithstanding this, the present invention is not limited to the HBM, but is applicable to any 3D-stacked memory in which a plurality of dies having a memory circuit implemented therein are stacked in the thickness direction.

In a 3D-stacked memory, four core dies each having a DRAM structure are stacked on a base die. The core die illustrated in FIG. 1 includes a first memory circuit 11A and a second memory circuit 11B. The first memory circuit 11A and the second memory circuit 11B are DRAMs having the same configuration.

The first memory circuit 11A includes a right channel I/F 12A, which is an interface for communicating with an external device. The second memory circuit 11B includes a left channel I/F 12B, which is an interface for communicating with an external device. Read and write data, addresses, and commands with respect to the first memory circuit 11A are transmitted through the right channel I/F 12A. Read and write data, addresses, and commands with respect to the second memory circuit 11B are transmitted through the left channel I/F 12B. The first memory circuit 11A includes 0th through 7th banks 13-0 through 13-7 (which will hereinafter be referred to as banks B0 through B7, respectively) which are DRAM memory cell arrays. The second memory circuit 11B also includes banks B0 through B7.

FIG. 2 is a drawing illustrating an example of the configuration of an HBM that is an example of the 3D-stacked memory. An HBM 10 illustrated in FIG. 2 includes a base die 20 and core dies 21 through 24. Each of the core dies 21 through 24 has the configuration illustrated in FIG. 1. The core dies 21 through 24 are stacked in this order on the upper face of the base die 20. The base die 20 and the core dies 21 through 24 have channel interconnections 14 implemented as through vias and micro bumps at the positions of the right channel I/F 12A and the left channel I/F 12B. In the core dies 21 through 24, the channel interconnections 14 constitute the right channel I/F 12A and the left channel I/F 12B. In FIG. 2, the channel interconnections 14 are illustrated only for part of the right channel I/F 12A for the sake of convenience of illustration.

FIG. 3 is a drawing illustrating the configuration of a cross-section of the HBM 10 taken along the dotted line 2A in FIG. 2. The cross-section illustrated in FIG. 3 corresponds to the position of the right channel I/F 12A and the left channel I/F 12B. A plurality of interconnections corresponding to the channel interconnections 14 (see FIG. 2) penetrate through the core dies 21 through 24. The interconnections include through vias 25 and micro bumps 26. In FIG. 3, reference numerals are provided only for a single through via and a single micro bump, which are representative ones of a plurality of through vias and a plurality of micro bumps.

A micro bump 26 provides an electrical connection between a through via 25 of a given core die and a through via 25 of a next core die situated over or under the given core die. A through via 25 of a given core die extends from the upper face to the lower face of the given core die, thereby allowing an electrical connection between the given core die and a die situated over or under the given core die, and also allowing an electrical connection between the die situated under the given core die and the die situated over the given core die.

The base die 20 has a physical layer (PHY) 28. The physical layer 28 has the function to perform conversion between logical signals used inside the HBM 10 and electrical signals for communicating with the outside of the HBM 10. Communication with the outside of the HBM 10 is performed through micro bumps 27 disposed on the lower face of the base die 20.

FIG. 4 is a drawing illustrating an example of the configuration of a memory system having the HBM that is an example of the 3D-stacked memory. The memory system illustrated in FIG. 4 includes the HBM 10, an interposer 30, and a CPU (central processing unit) 31.

The interposer 30, which may be an interconnection substrate having a multilayered structure, includes interconnections 32 disposed inside the multilayered structure. The HBM 10 and the CPU 31 are disposed on the upper face of the interposer 30. The HBM 10 and the CPU 31 are electrically coupled to each other through the interconnections 32. The CPU 31 applies address signals and command signals to the HBM 10 through the interconnections 32 to perform a read operation or a write operation specified by the commands with respect to the specified address of the HBM 10. In the case of a write operation, write data is supplied from the CPU 31 to the HBM 10 through the interconnections 32. In the case of a read operation, read data is supplied from the HBM 10 to the CPU 31 through the interconnections 32. In the example illustrated in FIG. 4, the HBM 10 is electrically coupled to the CPU 31. What is coupled to the HBM 10 is not limited to the CPU 31, and may alternatively be a GPU (i.e., graphics processing unit), a SoC (i.e., system on a chip), or the like, for example.

In the HBM 10 illustrated in FIG. 1 through FIG. 3, each of the four core dies 21 through 24 has two channels, i.e., the right channel I/F 12A and the left channel I/F 12B. A total of 8 channels are provided when the entirety of the HBM 10 is considered. When viewed from the CPU 31 illustrated in FIG. 3, each of the 8 channels of the HBM 10 is connected to 8 DRAMs, each of which is separately accessible. Each channel has a bit width of 144 bits, which may be used as 128 information bits and 16 error correction bits (i.e., redundant bits). Each of the 8 DRAMs has a separate address space.

Each of the 8 channels of the HBM 10 may be separately used as a 144-bit-width bus (i.e., a bus with 128 information bits). Alternatively, 4 channels of the 4 core dies 21 through 24 may be consolidated to form a single bus having a bit width of 576 bits. When 4 channels are consolidated to form a single bus, the 4 right channel I/Fs 12A may be consolidated, or the 4 left channel I/Fs 12B may be consolidated.

FIG. 5 is a drawing illustrating an example of the configuration of a single bus formed by consolidating 4 channels, which are either the 4 right channels or the 4 left channels of the 4 core dies 21 through 24. FIG. 5 illustrates an address space 40-1 which is part of the address space of the right channel of the core die 21, for example. Similarly, address spaces 40-2 through 40-4 are part of the address spaces of the right channels of the core dies 22 through 24, respectively.

When the 4 right channels of the 4 core dies 21 through 24 are separately used, respective write data are supplied to and stored at respective, different addresses in the 4 DRAMs. When the 4 right channels of the core dies 21 through 24 are consolidated into a single bus, one-word data having 512 information bits is stored at the same address in the 4 DRAMs (i.e., in the 4 first memory circuits 11A).

FIG. 5 illustrates 4 addresses 0x0 through 0x3 for each of the address spaces 40-1 through 40-4 of the 4 right channels of the core dies 21 through 24. In the case of the 4 right channels being consolidated into a single bus, one-word data 41 is stored at the same address (e.g., address 0x2 in the example of FIG. 5) in the address spaces 40-1 through 40-4. Namely, 4 data portions of the one-word data 41 corresponding to the 4 respective channels are stored at the same address 0x2 in the four first memory circuits 11A.

Figure 6:
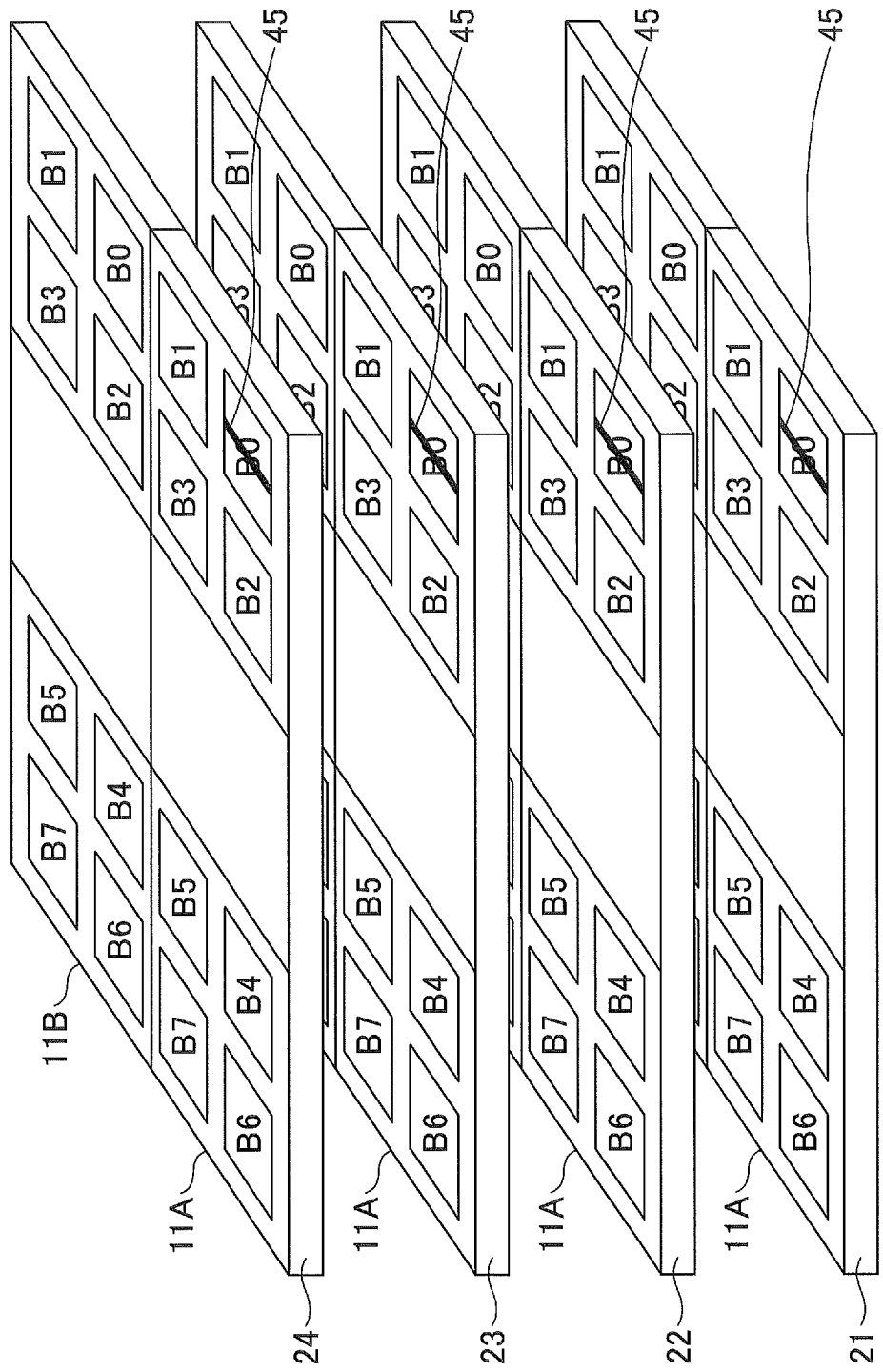
FIG. 6 is a schematic drawing illustrating data store locations in the case of data being stored at the same address in the 4 channels of 4 core dies.

FIG. 6 is a schematic drawing illustrating data store locations in the case of data being stored at the same address of the 4 right channels of the 4 core dies 21 through 24. When 4 data portions into which one word is divided are stored at the same address (e.g., 0x2 as was in the above-noted example) in the 4 first memory circuits 11A, the same physical locations 45 in the same banks B0 will have the one-word data stored therein as illustrated in FIG. 6. Namely, the data store locations 45 of the plural data portions of the one-word data are aligned in position in the plan view as viewed in the thickness direction (i.e., vertical direction) of the core dies 21 through 24. In other words, the data store locations 45 of the plural data portions of the one-word data are aligned vertically in a line.

As was previously described, each channel of the HBM 10 allows 16 error correction bits to be used for 128 information bits. The 128 information bits and the 16 error correction bits are stored at the same address as 144-bit data.

In the case of an error correction code utilizing an extended Hamming code allowing 1-bit error correction and 2-bit error detection, the size of error correction code for 64 bits is 8 bits. Similarly, the size of error correction code required for 128-bit information is 9 bits. The size of error correction code required for 512-bit information is 11 bits. As was described above, the HBM 10 has an area allocated for 16 error correction bits for 128 information bits. This arrangement is provided for the purpose of allowing 128 information bits to be divided into, and used as, two 64-bit channels. Namely, the bit width of 16 bits for an error correction code is provided for the purpose of coping with the case in which a channel having 128 information bits is divided into two 64-bit channels, with an error correction code being separately calculated for each channel.

FIG. 7 and FIG. 8 are drawings for explaining relationships between information bits and error correction bits. FIG. 7 illustrates an error correction code generated for a single chunk of data comprised of 128 information bits for each channel in the case of each channel being separately used. As is illustrated with respect to the address space 40-1 serving as a representative for the address spaces 40-1 through 40-4 of the 4 first memory circuits 11A, a 9-bit error correction code (ECC) 52 generated for 128-bit data 51 is stored at the same address as the data 51.

In this case, the 16-bit memory area allocated for the purpose of storing an error correction code at this store address (i.e., 0x2) has an unused area 53, the size of which is 7 bits (=16−9). In the example illustrated in FIG. 7, an error correction code is similarly calculated for each channel, so that a 7-bit unused area is generated in each channel. It follows that unused areas amounting to a total of 28 bits are generated in the 4 channels. These unused areas may store fixed-value data as dummy data. Alternatively, the unused areas may be utilized as effective memory areas in which data representing some useful information are stored.

FIG. 8 illustrates an error correction code generated for a single chunk of data comprised of 512 information bits consolidating the information bits of the 4 channels in the case of the 4 channels being used as a single channel. In the address space 40-1 among the address spaces 40-1 through 40-4 of the 4 first memory circuits 11A, a 11-bit error correction code (ECC) 62 generated for 512-bit data 61-1 through 61-4 is stored at the same address as the data 61-1. In this case, this store address (i.e., 0x2) in the address space 40-1 has an unused area 63-1 having a size of 5 bits (=16−11). The 16-bit memory area for storing an error correction code at this store address (i.e., 0x2) is not used in other address spaces 40-2 through 40-4, so that unused areas 63-2 through 63-4 each have a size of 16 bits. It follows that the unused areas amounting to a total of 53 bits (=16×3+5) are generated in the 4 channels. These unused areas may store fixed-value data as dummy data. Alternatively, the unused areas may be utilized as effective memory areas in which data representing some useful information are stored.

In the case of an error correction code being generated separately for each channel as illustrated in FIG. 7, the number of effectively usable bits in the unused areas is 28 bits whereas in the case of an error correction code being generated for the consolidated whole of the 4 channels as illustrated in FIG. 8, the number of effectively usable bits in the unused areas is 53 bits. In this manner, the larger the number of bits in one unit of error correction code generation, i.e., the larger the number of bits of consolidated data for which an error correction code is to be calculated, the smaller the number of error correction bits is. Accordingly, in the case of consolidating the 4 channels into a single bus and storing 512 information bits as one-word data, it is preferable to calculate an error correction code for the consolidated whole of this one word from the viewpoint of efficient utilization of memory areas.

Figure 9:
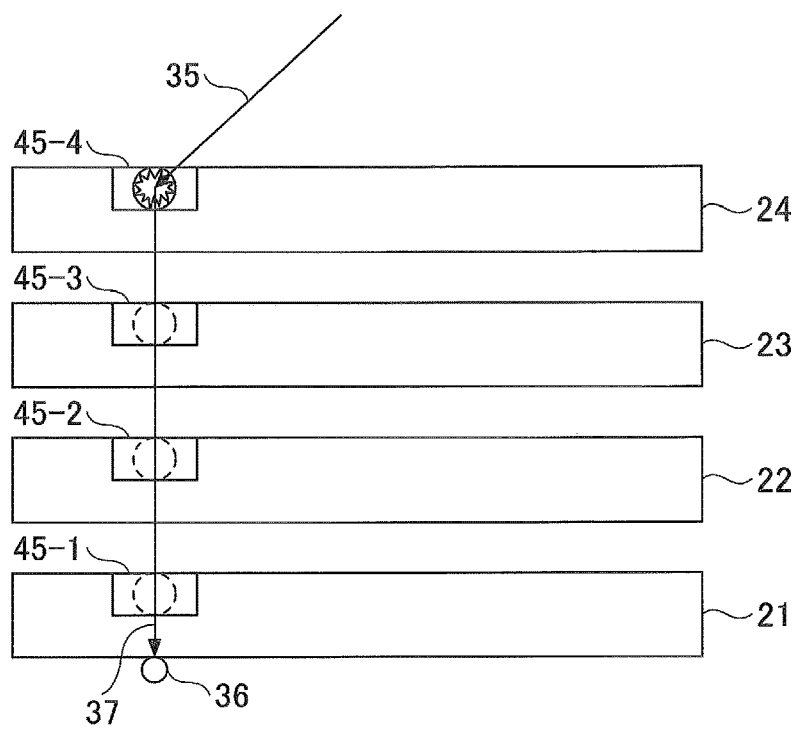
FIG. 9 is a drawing illustrating the problem of data destruction caused by the impact of a neutron ray.

FIG. 9 is a drawing illustrating the problem of data destruction caused by the impact of a neutron ray. In FIG. 9, one-word data is stored at the same memory locations 45-1 through 45-4 in the core dies 21 through 24. In the illustrated example, a secondary ion 36 generated upon the impact of a neutron ray at the memory location 45-4 in the uppermost core die 24 of the HBM flies along a path 37 in the direction perpendicular to the core dies 21 through 24 (i.e., in the thickness direction of the core dies). Along the path 37, a path of the secondary ion 36 passing through each core die is the shortest, and a path of the secondary ion 36 passing between adjacent core dies is also the shortest. It follows that the ion 36 does not lose much of the energy while passing through a core die and reaching the next core die situated immediately below. As a result, the secondary ion 36 generated by the impact of a neutron ray at the uppermost core die 24 may penetrate plural core dies 21 through 24 inclusive of the uppermost one, thereby creating a risk that data is destroyed by soft error in the plural core dies 21 through 24.

As was previously described, calculating an error correction code for one word comprised of 512 information bits for the 4 channels is preferable from the viewpoint of efficient utilization of memory areas. However, the flight of the secondary ion 36 in the vertical direction like the path 37 illustrated in FIG. 9 causes data destruction in a plurality of locations in one word. This may result in neither a proper error correction nor a proper error detection being performed in the case of the use of a typical error correction code that allows only a one-bit error correction and a two-bit error detection.

Figure 10:
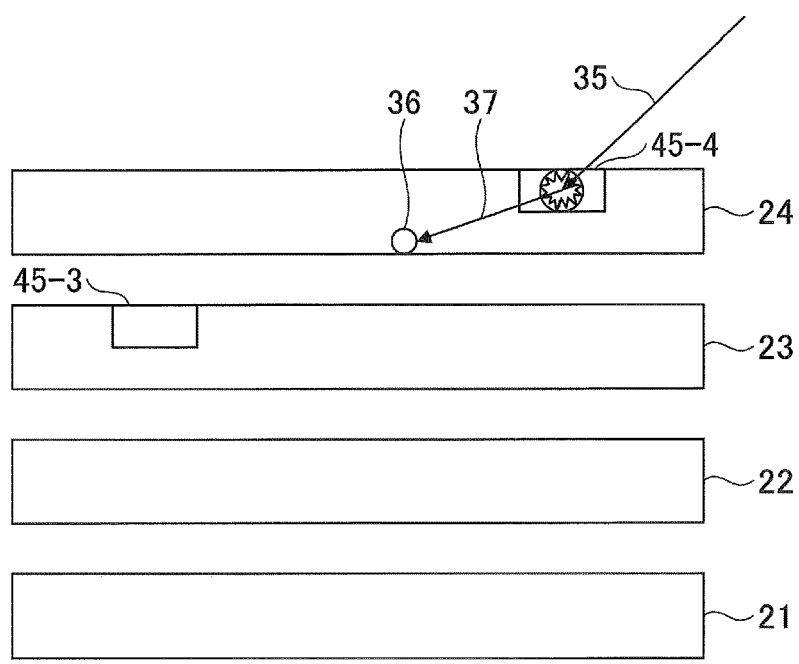
FIG. 10 is a drawing illustrating the slanting-direction flight of a secondary ion caused by the impact of a neutron ray.

FIG. 10 is a drawing illustrating the slanting-direction flight of a secondary ion caused by the impact of a neutron ray. In FIG. 10, the secondary ion 36 generated upon the impact of a neutron ray at the memory location 45-4 in the uppermost core die 24 of the HBM flies along the path 37 at an angle to the core dies 21 through 24. In this case, the path of the secondary ion 36 passing through each core die is relatively long, and the path of the secondary ion 36 passing between adjacent core dies is also relatively long. It follows that the ion 36 experiences relatively great energy attenuation while passing through a core die and reaching the next core die situated immediately below. As a result, in the example illustrated in FIG. 10, the secondary ion 36 generated by the impact of a neutron ray in the uppermost core die 24 experiences attenuation and stops inside the uppermost core die 24, without reaching the core die 23 situated immediately below. In this case, no data destruction occurs with respect to the data stored in the memory location 45-3 situated along the extension of the slanting-direction path 37 along which the secondary ion 36 flies Accordingly, storing the divided data portions of one word at different locations in the plan view such as the memory locations 45-4 and 45-3 illustrated in FIG. 10, for example, increases the likelihood of avoiding multibit errors in one word. Further, storing the 4 divided portions of one word such as to avoid the memory locations of three of them aligning in a line in the core dies 21 through 24 serves to prevent the flight of an ion in one direction from causing the errors of 3 or more bits. Storing the plural divided portions of one word at different locations in the plan view thus increases the likelihood that a proper error detection and a proper error correction can be performed based on an error correction code calculated for the entirety of one word. Namely, storing the divided portions of one word at different locations in the plan view serves to provide a 3D-stacked memory that is resistant to soft error caused by the impact of a neutron ray or the like.

In consideration of the above, the memory system of the present disclosures stores data at different write addresses in respective memory circuits when the N divided data portions of one word (N: an integer greater than or equal to 2) are to be stored in N respective memory circuits. In the following, an example of the configuration of such a memory system will be described.

Figure 11:
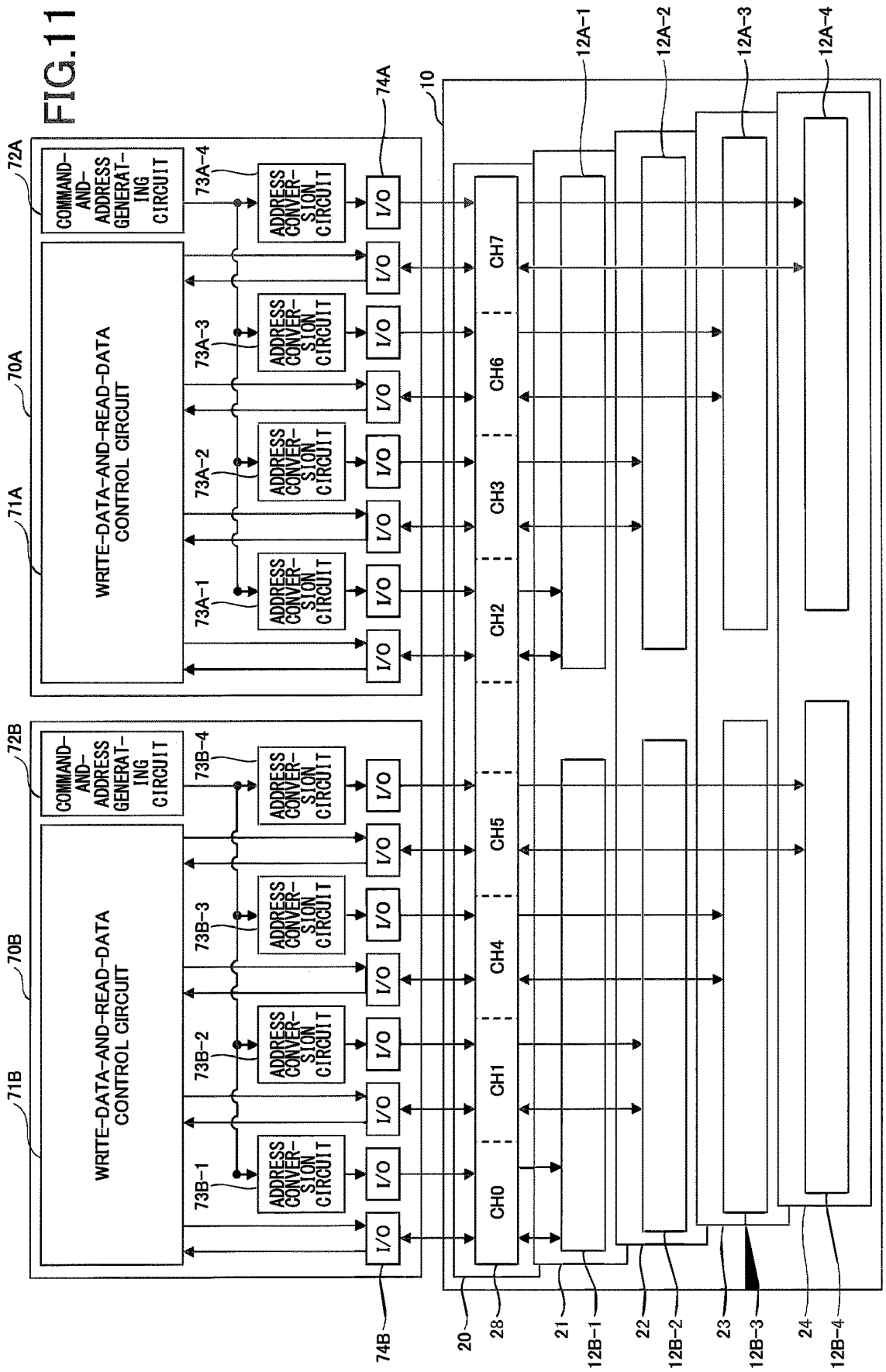
FIG. 11 is a drawing illustrating an example of the configuration of a memory system using a 3D-stacked memory.

FIG. 11 is a drawing illustrating an example of the configuration of a memory system using a 3D-stacked memory. The memory system illustrated in FIG. 11 includes the HBM 10 and memory access controllers 70A and 70B. The memory access controllers 70A and 70B may be embedded in the CPU 31 of the memory system illustrated in FIG. 4.

In FIG. 11, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

The HBM 10 illustrated in FIG. 11 has the configuration described in connection with FIG. 1 through FIG. 3. Specifically, the HBM 10 includes the base die 20 and the core dies 21 through 24. The base die 20 includes the physical layer 28, which includes 8 channels CH0 through CH7 in FIG. 11. Each of the core dies 21 through 24 includes right channel I/Fs 12A-1 through 12A-4 and left channel I/Fs 12B-1 through 12B-4. The core dies 21 through 24, which are stacked one over another in the vertical direction, have at least four respective memory circuits (e.g., the 4 first memory circuits 11A illustrated in FIG. 1 through FIG. 3) having the same structure.

The memory access controller 70A includes a write-data-and-read-data control circuit 71A, a command-and-address generating circuit 72A, an address conversion circuits 73A-1 through 73A-4, and a plurality of I/O circuits 74A. Only one representative I/O circuit among the plurality of I/O circuits 74A is designated by a reference numeral. The memory access controller 70B includes a write-data-and-read-data control circuit 71B, a command-and-address generating circuit 72B, an address conversion circuits 73B-1 through 73B-4, and a plurality of I/O circuits 74B. Only one representative I/O circuit among the plurality of I/O circuits 74B is designated by a reference numeral. The memory access controllers 70A and 70B have the same configuration, so that the memory access controller 70A will be taken as a representative example, and the configuration, functions, operations, and the like will be described in the following.

The write-data-and-read-data control circuit 71A transmits write data to the HBM 10 at the time of a write operation, and receives read data from the HBM 10 at the time of a read operation. At the time of a write operation, the write-data-and-read-data control circuit 71A supplies 4 write data to the 4 respective memory circuits (e.g., the 4 first memory circuits 11A illustrated in FIG. 1 through FIG. 3). At the time of a read operation, the write-data-and-read-data control circuit 71A receives 4 read data from the 4 respective memory circuits. These 4 data correspond to the 4 respective channels, i.e., the right channel I/Fs 12A-1 through 12A-4 of the HBM 10.

The command-and-address generating circuit 72A transmits a command indicative of a write operation or a read operation to the HBM 10, and transmits an address indicative of a write location or a read location to the HBM 10. In the case of the 4 channels being consolidated into a single channel to write one-word data comprised of 512 information bits, the command-and-address generating circuit 72A generates a single common write address as the write addresses at which the 4 write data are stored in the 4 respective memory circuits.

The following description will be given with respect to the configuration in which the 4 channels are consolidated into and used as a single bus. Nonetheless, operations that allow the 4 channels to be separately used without being consolidated may also be possible. In this case, the command-and-address generating circuit 72A may generate write addresses separately as the write addresses at which the write data is stored in a desired number of one or more memory circuits.

The address conversion circuits 73A-1 through 73A-4 convert the address supplied from the command-and-address generating circuit 72A according to a predetermined rule to generate converted addresses. This predetermined rule is such that the pre-conversion address and the converted address have one-to-one correspondence with each other in each channel, and such that the 4 converted addresses obtained by converting a single common address in the 4 channels are different from each other. It may be further preferable for the address conversion to be such that the locations of the 4 converted addresses in the plan view are situated as far away as possible from each other in the core dies 21 through 24. Especially between two core dies vertically next to each other, the distance between two converted addresses is preferably as great as possible.

As was described above, the address conversion circuits 73A-1 through 73A-4 convert one write address to generate 4 different addresses for 4 respective memory circuits, followed by supplying these 4 addresses to the 4 memory circuits as write addresses. At the time of a read operation also, the address conversion circuits 73A-1 through 73A-4 convert one read address to generate 4 different addresses for 4 respective memory circuits, followed by supplying these 4 addresses to the 4 memory circuits as read addresses.

In the example illustrated in FIG. 11, the address conversion circuits 73A-1 through 73A-4 are disposed inside the memory access controller 70A. However, the location of the address conversion circuits 73A-1 through 73A-4 is not limited to this location. The address conversion circuits 73A-1 through 73A-4 may alternatively be disposed outside the memory access controller 70A and between the memory access controller 70A and the HBM 10.

The number of channels to be consolidated is not limited to 4. For example, 2 channels may be consolidated and used as a single bus. In this case, the command-and-address generating circuit 72A may generate a single common write address as the write addresses at which 2 write data are stored with respect to the 2 right channels of the core dies 21 and 22, for example. The address conversion circuits 73A-1 and 73A-2 may convert the one write address to generate 2 different addresses for 2 respective memory circuits, followed by supplying these 2 addresses to the 2 memory circuits as write addresses.

The 4 write data may include information bits and error correction bits (i.e., check bits) generated based on the information bits. Namely, the write-data-and-read-data control circuit 71A may produce write data including information bits and error correction bits (i.e., check bits) generated based on the information bits. When generating the error correction bits from the information bits, the write-data-and-read-data control circuit 71A may generate 11 error correction bits with respect to the consolidated whole of 512 information bits for the 4 channels.

The write-data-and-read-data control circuit 71A may assign the 11 error correction bits generated as described above to a predetermined one channel (e.g., the channel corresponding to the right channel I/F 12A-1 of the core die 21). The write-data-and-read-data control circuit 71A may assign a fixed value to, or write some useful information in, the unused areas (i.e., areas set aside for an error correction code) in the above-noted one channel and the three remaining channels.

Although the unit of error-correction-code generation is 512 bits in the example noted above, the unit of error-correction-code generation is not limited to 512 bits corresponding to the 4 channels. For example, the 4 write data may include error correction bits generated based on 256 information bits corresponding to two predetermined channels and error correction bits generated based on 256 information bits corresponding to the two remaining channels. Namely, the error correction bits included in the 4 write data may include error correction bits generated with respect to consolidated data comprised of information bits corresponding to at least 2 write data among the 4 write data. Generating an error correction code for consolidated data comprised of information bits of at least 2 channels, rather than generating an error correction code separately for each channel, enables the efficient utilization of memory areas.

Figure 12:
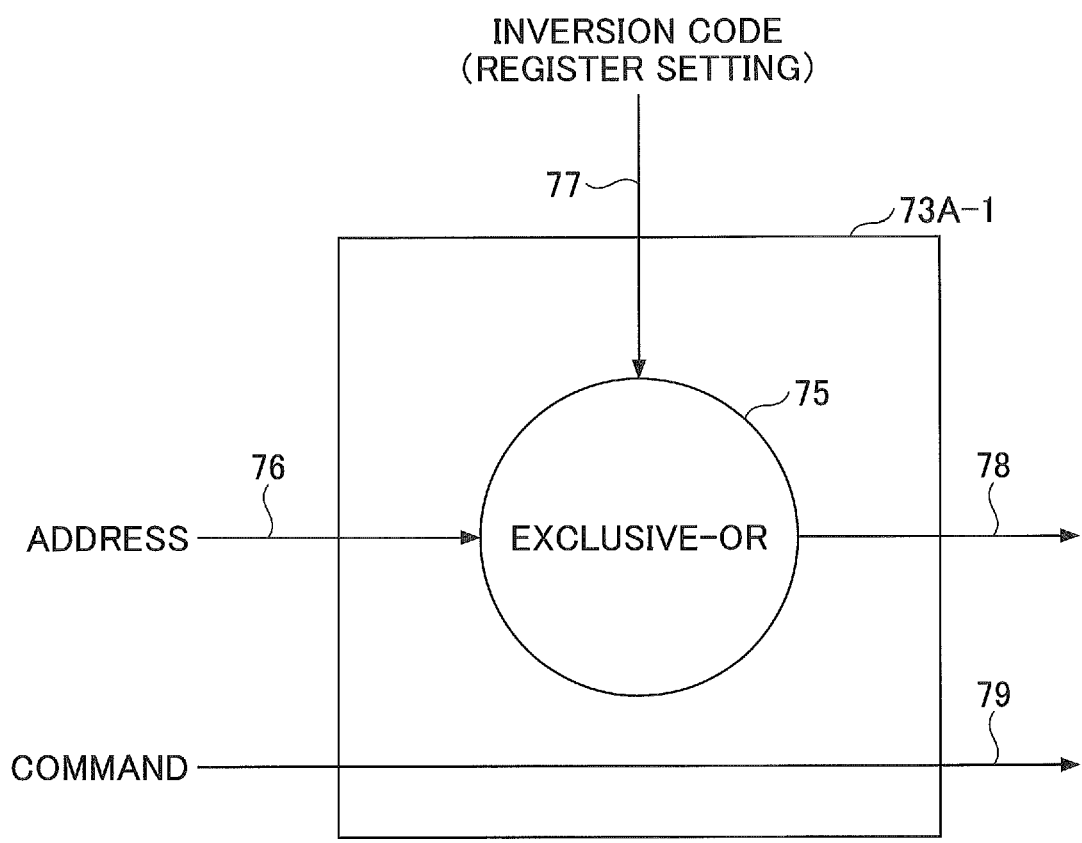
FIG. 12 is a drawing illustrating an example of the configuration of an address conversion circuit.

FIG. 12 is a drawing illustrating an example of the configuration of the address conversion circuit. FIG. 12 illustrates the address conversion circuit 73A-1 as a representative. Each of the address conversion circuits 73A-1 through 73A-4 and 73B-1 through 73B-4 illustrated in FIG. 11 may have the configuration of the address conversion circuit illustrated in FIG. 12.

The address conversion circuit 73A-1 illustrated in FIG. 12 includes an exclusive-OR gate 75 that calculates a bitwise exclusive OR operation between the address supplied from the command-and-address generating circuit 72A and an inversion code provided as a register value. The inversion code may be stored in an internal register disposed inside the address conversion circuit 73A-1, or may be stored in an external register (e.g., a register disposed in the write-data-and-read-data control circuit 71A).

The exclusive-OR gate 75 calculates a bitwise exclusive-OR operation between the input address and the predetermined inversion code to generate a converted address. In this case, the input address and the converted address are in one-to-one correspondence with each other. Using different inversion codes for the respective address conversion circuits 73A-1 through 73A-4 allows the 4 converted addresses to be different from each other. The use of a bitwise exclusive-OR operation to implement the address conversion allows a simple circuit configuration to realize a desired conversion process. As illustrated in FIG. 12, the command supplied from the command-and-address generating circuit 72A is passed to the output, with the value of each bit remaining unchanged without being subjected to any conversion.

Figure 13:
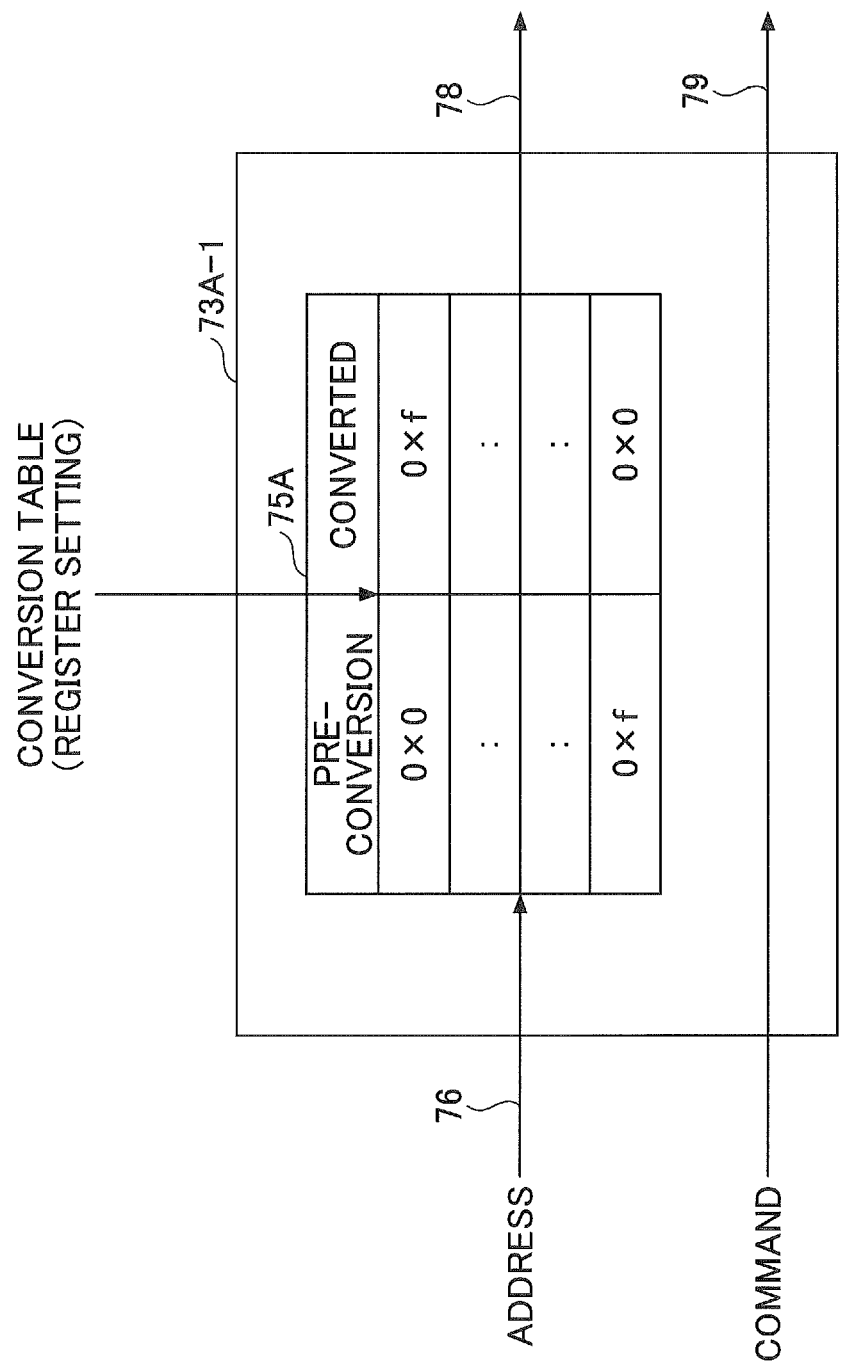
FIG. 13 is a drawing illustrating an example of the configuration of an address conversion circuit.

FIG. 13 is a drawing illustrating another example of the configuration of the address conversion circuit. FIG. 13 illustrates the address conversion circuit 73A-1 as a representative. Each of the address conversion circuits 73A-1 through 73A-4 and 73B-1 through 73B-4 illustrated in FIG. 11 may have the configuration of the address conversion circuit illustrated in FIG. 13.

The address conversion circuit 73A-1 illustrated in FIG. 13 includes a conversion table (i.e., lookup table) 75A which provides correspondences between pre-conversion addresses and converted addresses. The conversion table 75A may be stored in an internal register disposed inside the address conversion circuit 73A-1. Each table entry in the conversion table 75A may be settable as a register value from an external source.

The conversion table 75A receives a pre-conversion address as an input so as to output a converted address corresponding to the input address. Setting appropriate table entries makes it possible to provide one-to-one correspondences between input addresses and converted addresses. Providing different entries in the conversion tables of the respective address conversion circuits 73A-1 through 73A-4 allows the 4 converted addresses to be different from each other.

As was previously described, it may be preferable for the address conversion to be such that the locations of the 4 converted addresses in the plan view are situated as far away as possible from each other in the core dies 21 through 24. Especially between two core dies vertically next to each other, the distance between two converted addresses is preferably as great as possible. Providing a proper inversion code in FIG. 12 or providing proper entries in the conversion table in FIG. 13 enables the realization of address conversion that implements such preferable positional arrangements.

FIG. 14 is a drawing illustrating an example of inversion codes used for address conversion. Using the inversion codes illustrated in FIG. 14 enables the realization of proper address conversion in the address conversion circuits 73A-1 through 73A-4 each of which is implemented as an exclusive-OR gate as illustrated in FIG. 12.

Each of the inversion codes in FIG. 14 is a bit sequence having a length of 3 bits. These bit sequences are "000" for the first core die (i.e., core die 21), "011" for the second core die (i.e., core die 22), "100" for the third core die (i.e., core die 23), and "111" for the fourth core die (i.e., core die 24). An address may include a 3-bit bank address for specifying a bank and a 8-bit intra-bank address for specifying a data store location inside the bank, for example. The inversion codes illustrated in FIG. 14 are applied to the 3-bit bank address. A bitwise exclusive-OR value between the bank address and each inversion code becomes a converted bank address.

FIG. 15 is a drawing illustrating pre-conversion addresses and converted addresses in the case of using the inversion codes illustrated in FIG. 14. A description of the case in which a pre-conversion bank address is "010", for example, will be as follows. With respect to the first core die, an exclusive-OR operation between the bank address "010" and the inversion code "000" produces a converted bank address "010". With respect to the second core die, an exclusive-OR operation between the bank address "010" and the inversion code "011" produces a converted bank address "001". With respect to the third core die, an exclusive-OR operation between the bank address "010" and the inversion code "100" produces a converted bank address "110". With respect to the fourth core die, an exclusive-OR operation between the bank address "010" and the inversion code "111" produces a converted bank address "101".

Figure 16:
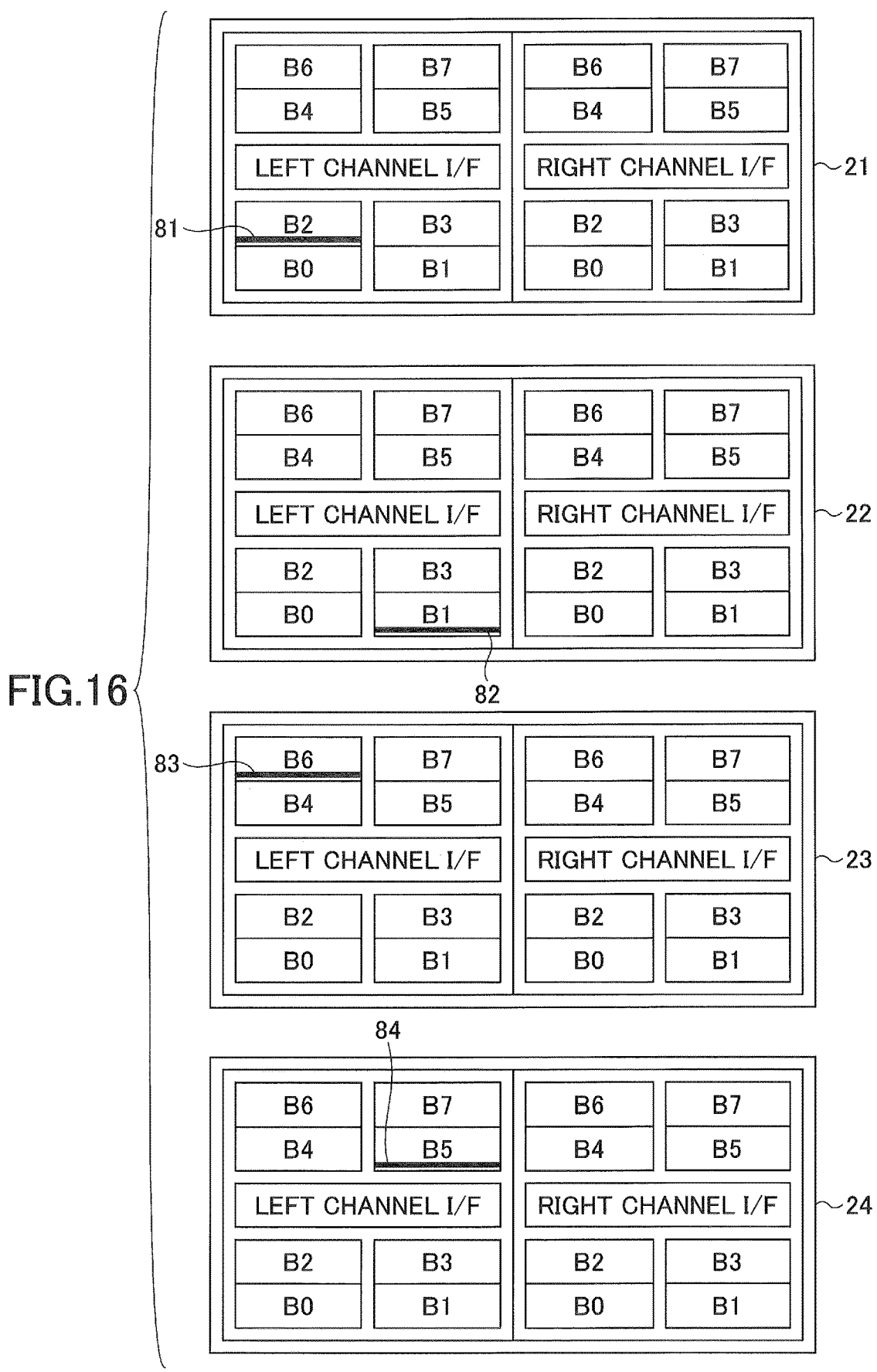
FIG. 16 is a drawing illustrating an example of data store locations in the case of using the inversion codes illustrated in FIG. 14.

FIG. 16 is a drawing illustrating an example of data store locations in the case of using the inversion codes illustrated in FIG. 14. In FIG. 16, the divided portions of one-word data are stored at predetermined addresses in the banks indicated by the converted bank addresses which are obtained through bank-address conversions illustrated in FIG. 15 with respect to the pre-conversion bank address "010", for example.

As illustrated in FIG. 16, the first portion of one-word data is stored at a predetermined location 81 in the bank B2 indicated by the bank address "010" in the core die 21. The second portion of one-word data is stored at a predetermined location 82 in the bank B1 indicated by the bank address "001" in the core die 22. The third portion of one-word data is stored at a predetermined location 83 in the bank B6 indicated by the bank address "110" in the core die 23. The fourth portion of one-word data is stored at a predetermined location 84 in the bank B5 indicated by the bank address "101" in the core die 24.

In this manner, converting a bank address through an exclusive-OR operation using the inversion codes illustrated in FIG. 14 allows the plural divided portions of one-word data to be stored at respective, different physical locations in the plan view as illustrated in FIG. 16. In this example, a plurality of different bank addresses are generated by converting a bank address. Accordingly, the plural divided portions of one-word data are stored in respective, different banks, which allows the physical store locations in the plan view to be significantly different from core die to core die. A change in upper address bits may produce a significant positional change whereas a change in lower address bits may produce a small positional change. In such a case, applying a conversion process to upper bits is more preferable for the purpose of providing significantly different store locations from core die to core die. Needless to say, a conversion process may be applied to all the address bits, rather than being applied to upper bits only.

Figure 17:
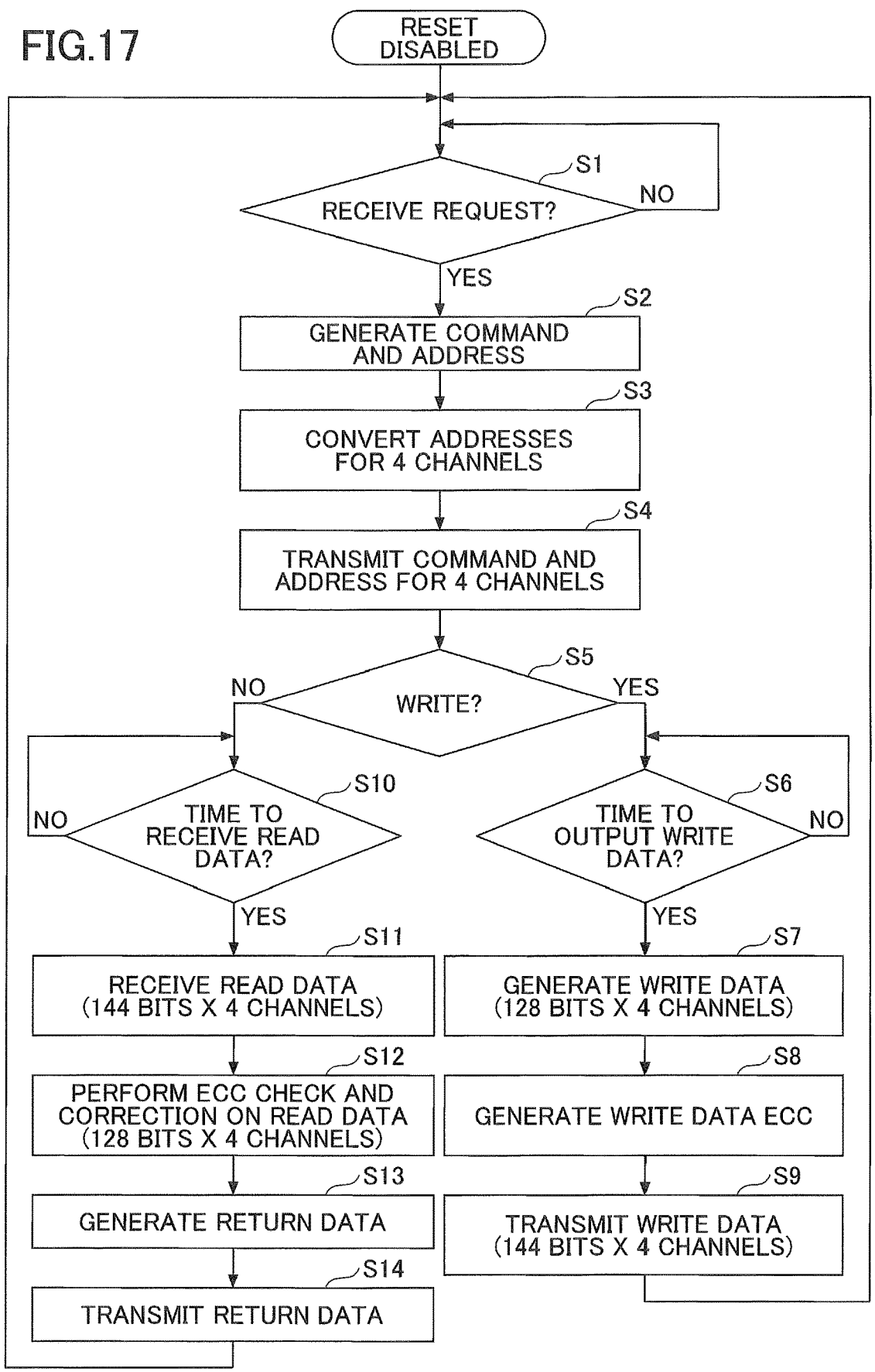
FIG. 17 is a flowchart illustrating an example of data write-and-read operations performed by a memory access controller.

FIG. 17 is a flowchart illustrating an example of data write-and-read operations performed by a memory access controller. The procedure illustrated in FIG. 17 may be performed by the various units of the memory access controller 70A illustrated in FIG. 11, for example.

It may be noted that, in FIG. 17, an order in which the steps illustrated in the flowchart are performed is only an example. The scope of the disclosed technology is not limited to the disclosed order. For example, a description may explain that an A step is performed before a B step is performed. Despite such a description, it may be physically and logically possible to perform the B step before the A step while it is possible to perform the A step before the B step. In such a case, all the consequences that affect the outcomes of the flowchart may be the same regardless of which step is performed first. It then follows that, for the purposes of the disclosed technology, it is apparent that the B step can be performed before the A step is performed. Despite the explanation that the A step is performed before the B step, such a description is not intended to place the obvious case as described above outside the scope of the disclosed technology. Such an obvious case inevitably falls within the scope of the technology intended by this disclosure.

As reset is disabled, the memory access controller 70A waits to receive a request such as a write request or a read request from an external source (e.g., the main logic of the CPU 31 illustrated in FIG. 4) (No in step S1). A request includes a command indicative of either a write operation or a read operation and a write or read address. Write data is also included in the case of a write operation. Upon receiving a request (yes in step S1), the command-and-address generating circuit 72A of the memory access controller 70A generates a command for the HBM 10 corresponding to the received command, and also generates a single address for the HBM 10 corresponding to the received address (step S2).

Upon receiving the single generated address, the address conversion circuits 73A-1 through 73A-4 of the memory access controller 70A generate, based on this single address, 4 converted addresses which are different for the 4 respective channels. As was previously described, the command is maintained as it is, without any conversion. Subsequently, the I/O circuits 74A of the memory access controller 70A transmit the command and the 4 converted addresses to the respective channels of the HBM 10 (step S4).

In the case of the requested operation being a write operation (Yes in step S5), the memory access controller 70A proceeds to step S6 to perform subsequent processes. In the case of the requested operation being a read operation (No in step S5), the memory access controller 70A proceeds to step S11 to perform subsequent processes.

In the case of a write operation, the write-data-and-read-data control circuit 71A of the memory access controller 70A waits for the arrival of the time to output write data (No in step S6). A time interval from the time to apply a write command to the time to apply write data is a predefined constant length with respect to the HBM 10. The memory access controller 70A thus waits for the passage of this time length.

Upon the arrival of the time to output write data (Yes in step S6), the write-data-and-read-data control circuit 71A performs, in addition to other processes, the process of converting the data-bus width of write data received from an external source to generate write data for the HBM 10 (step S7). This write data has 128 bits for each of the 4 channels, thereby having a total bit width of 512 bits.

The write-data-and-read-data control circuit 71A further generates an 11-bit error correction code with respect to the 512-bit information bit sequence of the write data (step S8). The write-data-and-read-data control circuit 71A allocates the error correction code to the error-correction-code area of a predetermined one channel. The size of the error-correction-code area is 16 bits. Since the error correction code assigned to this area is 11 bits, a fixed value is set to the 5 remaining bits. A fixed value is also set to the error-correction-code areas of the 3 remaining channels that are different from the predetermined one channel. In this case, it does not matter which one of 0 and 1 is set as the fixed value because these error-correction-code areas are not used. The write data supplied to the HBM 10 has a total bit width of 576 bits, which includes, for each channel, 144 bits inclusive of the information bits and the error-correction-code area. It may be noted that the error-correction-code areas may be efficiently utilized by storing bit values representing some information rather than storing a fixed value.

Subsequently, the I/O circuits 74A of the memory access controller 70A transmit the 144-bit channel data portions of the 576-bit write data to the respective channels of the HBM 10 (step S9). The procedure of the memory access controller 70A thereafter returns to step S1.

In the case of a read operation, the write-data-and-read-data control circuit 71A of the memory access controller 70A waits for the arrival of the time to receive read data (No in step S10). A time interval (i.e., latency) from the time to apply a read command to the time for read data to be output is a predefined time length for the HBM 10. The memory access controller 70A thus waits for the passage of the time length corresponding to this latency.

Upon the arrival of the time to receive read data (Yes in step S10), the write-data-and-read-data control circuit 71A receives read data from the HBM 10 (step S11). This read data has 144 bits for each of the 4 channels, thereby having a total bit width of 576 bits.

The write-data-and-read-data control circuit 71A performs error-detection and error-correction processes with respect to the received read data (step S12). The write-data-and-read-data control circuit 71A corrects the read data when the read data contains correctable error, and performs a predetermined operation (e.g., an operation to halt the system) when the error is uncorrectable. The error-correction-code portion becomes unnecessary after the completion of error-detection and error-correction processes. What is obtained as read data in the end is thus 512 bits (=128 bits×4) including only the information bits.

The write-data-and-read-data control circuit 71A performs, in addition to other processes, the process of converting the data-bus width of 512-bit information bit data obtained upon the error-detection and error-correction processes, thereby generating return data to be transmitted to the source of the request (step S13). Subsequently, the memory access controller 70A transmits the return data to the source of the request (step S14). The procedure of the memory access controller 70A thereafter returns to step S1.

According to at least one embodiment, a memory system for a 3D stacked memory that is resistant to soft error attributable to a neutron ray is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A memory system, comprising:
   N core dies (N: an integer greater than one) stacked in a thickness direction thereof and including N respective memory circuits having a same structure, the N respective memory circuits being situated at respective different positions in the thickness direction of the N core dies;
   a control circuit configured to supply N write data to the N respective memory circuits;
   an address generating circuit configured to generate a single common address as write addresses at which the N write data are to be stored in the N respective memory circuits; and
   an address conversion circuit configured to convert the single common address to generate N addresses which are different for the N respective memory circuits and to supply the N addresses as write addresses to the N respective memory circuits such that the N write data are stored at the respective different positions in the thickness direction as well as at respective different positions in a plan view as viewed in the thickness direction.

2. The memory system as claimed in claim 1, wherein the N write data includes information bits and check bits generated based on the information bits, the check bits including check bits generated with respect to data that is obtained by consolidating information bits corresponding to at least two write data among the N write data.

3. The memory system as claimed in claim 1, wherein the address conversion circuit is configured to generate the N addresses by calculating an exclusive-OR operation between the single common address and inversion codes that are different for the N respective memory circuits.

4. A method of controlling a 3D-stacked memory which includes N core dies (N: an integer greater than one) stacked in a thickness direction thereof, the N core dies including N respective memory circuits having a same structure, the N respective memory circuits being situated at respective different positions in the thickness direction of the N core dies, the method comprising:
   supplying N write data to the N respective memory circuits;
   generating a single common address as write addresses at which the N write data are to be stored in the N respective memory circuits;
   converting the single common address to generate N addresses which are different for the N respective memory circuits; and
   supplying the N addresses as write addresses to the N respective memory circuits such that the N write data are stored at the respective different positions in the thickness direction as well as at respective different positions in a plan view as viewed in the thickness direction.

* * * * *